United States Patent [19]
Botti et al.

[11] Patent Number: 4,878,032
[45] Date of Patent: Oct. 31, 1989

[54] AMPLIFIER STAGE WITH COLLECTOR OUTPUT

[75] Inventors: Edoardo Botti, Mortara; Aldo Torazzina, Monza; Fabrizio Stefani, Cardano al Campo, all of Italy

[73] Assignee: S-Thomson Microelectronics S.p.A., Catania, Italy

[21] Appl. No.: 180,743

[22] Filed: Apr. 12, 1988

[30] Foreign Application Priority Data

Apr. 21, 1987 [IT] Italy ................. 20195 A/87

[51] Int. Cl.⁴ .............................................. H03F 3/26
[52] U.S. Cl. .................................... 330/263; 330/265; 330/267
[58] Field of Search ............... 330/118, 255, 263, 265, 330/267, 268, 270, 273, 274

[56] References Cited

U.S. PATENT DOCUMENTS 4,431,972  2/1984  Ishii et al. ........................... 330/267
4,471,323  9/1984  Trilling ............................... 330/268

Primary Examiner—Steven Mottola
Attorney, Agent, or Firm—Guido Modiano; Albert Josif

[57] ABSTRACT

This amplifier stage has saturation control and high dynamics. The stage comprises a pair of input current sources connected in series between a pair of reference voltage lines, a pair of output transistors, connected between the pair of reference voltage lines and defining an intermediate output terminal and a driving circuit comprising active elements and interposed between the input current sources and the output transistors. Saturation control is achieved through a pair of control circuits, one for each output transistor, comprising each a resistor interposed between the driving circuit and the respective output transistor so as to preset the balance saturation gain of the respective output transistor, and a transistor connected with its base to the driving circuit and with its collector and emitter between the output of the amplifier stage and the intermediate connection point between the input current sources, so as to define a negative feedback reducing imbalances existing between the currents fed by the input current sources, and therefore prevent high saturation levels of the transistors.

8 Claims, 2 Drawing Sheets

4,878,032

AMPLIFIER STAGE WITH COLLECTOR OUTPUT

BACKGROUND OF THE INVENTION

The present invention relates to an amplifier stage with collector output.

As is known, in amplifier stages with collector output it can be important to prevent any transistor included in the amplification chain from reaching high saturation, so that the current gain of each transistor drops to very low values.

This behavior in fact causes a decrease of the switching speed of the amplifier, when the transistors switch from a saturation condition to linear operation. If the amplifier is negatively fedback, in the regions proximate to the outputs of the transistors which switch from saturation to linear operation, undesired transients may occur.

Such operation at high saturation may also occur for example in the case of severe imbalance at the input. To this end, let's consider, for example, the schematic diagram of an amplifier with low drop-out (that is wherein the difference between the available supply voltage and the maximum peak-to-peak output voltage is low) illustrated by way of example in FIG. 1. In this figure the current sources $I_1$ and $I_2$ represent the input stage, generally composed by a voltage/current converter stage. The transistors $Q_1$–$Q_4$ and the constant current source $Q_7$, together with the resistor $R_1$, represent the driving circuit, while $Q_5$ and $Q_6$ constitute the two final transistors connected between two reference potential lines $V_{CC}$ and $-V_{CC}$ and defining between themselves, at point D, the output of the amplifier which is connected to a load $R_L$.

In this known circuit, an imbalance of the currents $I_1$ and $I_2$ causes an imbalance of the entire stage. In particular if it occurs that $$(I_1 - I_2) \cdot \beta_{Q1} \cdot \beta_{Q2} > I_{CQ7} + \frac{V_{CC} - V_{BEQ3}}{\beta_{Q3} \cdot R_1}$$

the transistor $Q_2$ is saturated, and similarly, with the transistor $Q_2$ saturated, if the relation $$\frac{V_{CC} - V_{BEQ3}}{R_1} \cdot \beta_{Q6} > \frac{V_{CC}}{R_L}$$

is verified $Q_6$ is saturated.

In the same manner, if the current $I_2$ is sufficiently higher than the current $I_1$, the transistors $Q_7$ and $Q_5$ are saturated.

The saturation levels of the indicated transistors, not being controlled, may be very high, that is the current gain of the saturated transistors may drop to very low values, with the previously described negative consequences.

To avoid high saturation of the transistors, it is already known to provide Schottky diodes connected between the base and the collector of each trnsistor subject to high saturation, so as to remove part of the base current and prevent an excessive saturation of the protected transistor. However, even this solution is disadvantageous since the Schottky diodes connected to the final transistors, in order to be able to conduct even high currents at low voltage, may require a large area (which is not desirable in the case of integrated systems with high integration level) and furthermore the integration of said diodes in an integrated circuit requires a greater number of masks, and therefore entails a greater complexity in production and greater costs of the entire amplifier.

Other known solutions make use of structures comprising a transistor and a diode approriately connected to the transistor to be protected and to the input stage. However, even these solutions are not satisfactory due to the high number of components and to the stability problems of the loop formed by each transistor with the respective antisaturation circuit.

SUMMARY OF THE INVENTION

Accordingly, the aim of the present invention is to provide an amlifier stage with collector output, which provides an effective control of the saturation of the transistors included in the amplifier stage, so as to reduce the problems of switching speed and of undesired transients existing in known circuits.

Within this aim, a particular object of the present invention is to provide an amplifier stage having a simple, easily integratable structure, with their part intended to reduce the saturation of the transistors requiring a limited integration area.

Still another object of the present invention is to provide an amplifier stage having a saturation control part which may be integrated without requiring masks or additional process steps.

Not least object of the present invention is to provide an amplifier stage which operates in a fully reliable manner and has high stability.

This aim, the objects mentioned, and other which will become apparent hereinafter, are achieved by an amplifier stage with collector output, as defined in the accompanying claims.

BRIEF DESCRIPTION OF THE DRAWINGS

The characteristics and advantages of the invention will become apparent from the description of some preferred but not exclusive embodiments, illustrated only by way of non-limitative example in the accompanying drawings, wherein.

DESCRIPTION OF THE PREFERRED EMBODIMENTS

Figure 1:
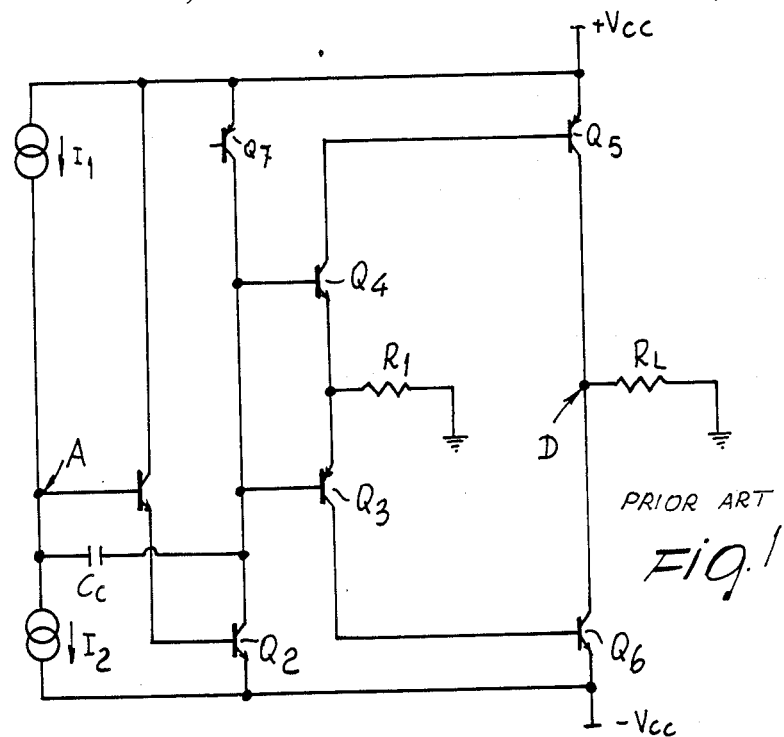
FIG. 1 is a simplified diagram of an amplifier stage with collector output according to the prior art.

Hereinafter reference is made only to FIGS. 2 to 4, referring, for FIG. 1, to the preceding description. It should be noted in any case that the components of the amplifier stage according to the invention common to the known embodiment of FIG. 1 have been indicated, for the sake of consistency, with the same reference numerals.

Figure 2:
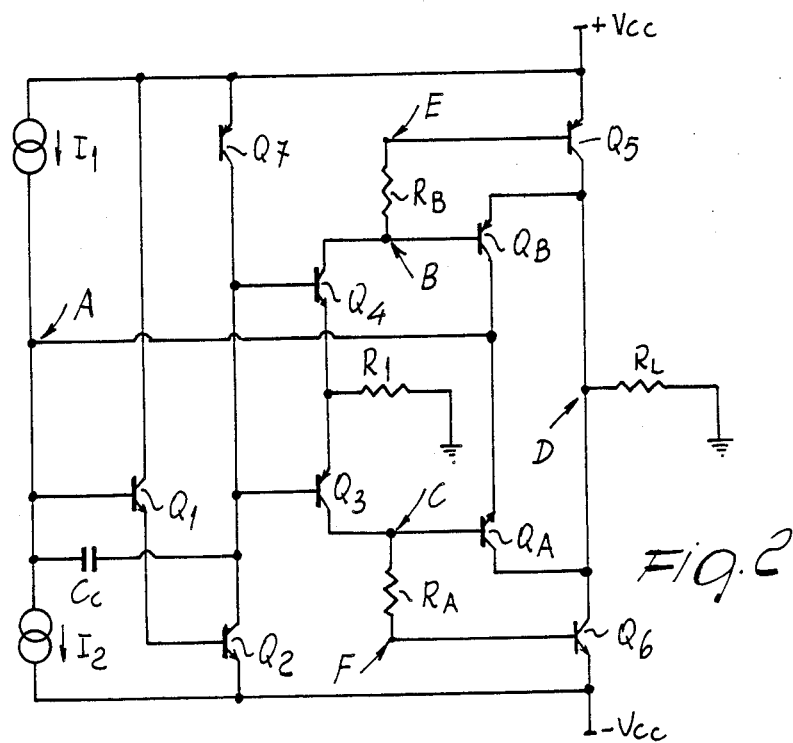
FIG. 2 is the general circuit diagram of an amplifier stage according to the invention.
Figure 3:
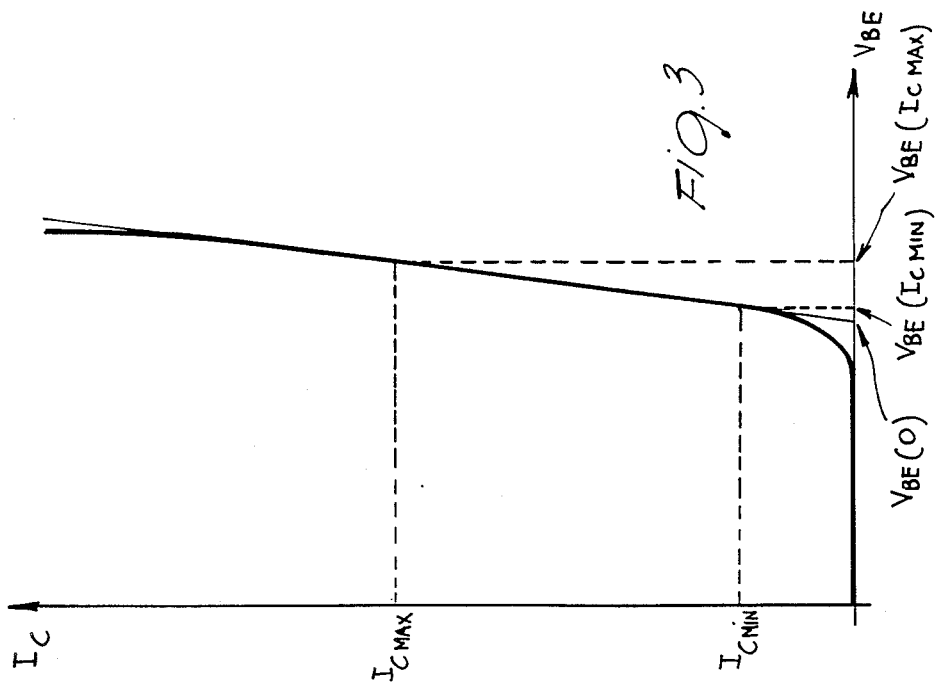
FIG. 3 illustrates the dependence of the collector current on the base-emitter voltage of a transistor.

Thus, with reference to FIG. 2, in the amplifier stage according to the invention, the input stage has been indicated again by means of the two current sources $I_1$ and $I_2$. Similarly to the known circuit of FIG. 1, the driving part comprises the transistors $Q_1$–$Q_4$ and $Q_7$ (this last one constituting a constant current source) for driving two output transistors $Q_5$ and $Q_6$ connected between the positive power supply $V_{CC}$ and the negative power supply $-V_{CC}$. The two output transistors are mutually connected with their collectors at point D which represents the output of the stage for power supplying the load, here represented by the resistor $R_L$. As in the prior art, the driving circuit has two output terminals, defined by the two collectors of the transistors $Q_3$ and $Q_4$, each connected to the base of the output transistors $Q_5$ and $Q_6$ to drive it.

According to the invention, however, between the driving outputs defined by the collectors of $Q_4$ and $Q_3$ and the bases of the output transistors two saturation control circuits are provided adapted to prevent high saturation of the connected output transistors and to reduce the effects of any high imbalances in the currents of the input sources on the driving stage. In detail, each saturation control circuit comprises a resistor $R_B$ and $R_A$ connected between a driving output and the respective output transistor, and a transistor $Q_B$ and $Q_A$ having its base connected to the respective driving output and connected with its emitter and collector terminals between the output D of the amplifier stage and the input A thereof, and more precisely to the intermediate point between the current sources $I_1$ and $I_2$.

A capacitor $C_C$ is also provided, which was already present in known stages to ensure the stability of the closed-loop system, and has here, furthermore, also the function of stabilizing the operation of the saturation control circuit.

Hereinafter the operation of the amplifier stage according to the invention is explained. For a better understanding, hereinafter some quantities are defined and some exemplifying hypotheses are made which are the more accurate the less is the saturation level of the final transistors. In particular let's define:

$R_{BEQX}$ the linearized incremental resistance of the base-emitter junction of a generic transistor $Q_X$ in a given interval of the collector current comprised between the currents $I_{CMIN}$ and $I_{CMAX}$. In this internal we thus have:

$$R_{BEQX} = \frac{V_{BEQX(ICMAX)} - V_{BEQX(ICMIN)}}{I_{CMAX} - I_{CMIN}}$$

therefore we have:

$$V_{BEQX}(I_C) \simeq V_{BEQX}(O) + I_C \cdot R_{BEQX} \quad \text{(I)}$$

wherein $V_{BEQX}(I_C)$ is the base-emitter voltage of a generic transistor $Q_X$ at the collector current $I_C$ $V_{BEQX}(O)$ is the interseption on the axis of the abscissas of the straight line with slope $R_{BEQX}$ passing through the point $V_{BEQX}(I_{CMAX})$, $I_{CMAX}$ (see FIG. 3) $R_{QX,sat}$ is the saturation resistance of the generic transistor $Q_X$, so that we have:

$$V_{CEQX,sat} \simeq R_{QX,sat} I_c$$

$V_{BEQB}$ is the base-emitter voltage of the transistor $Q_B$ in the on state $V_{CBQA}$ is the collector base voltage of the transistor $Q_A$ in the reverse biased state.

Suppose, furthermore, that these last two quantities are constant, in particular consider $$V_{BEQB} = V_{BEQ5}(O) \quad \text{(II)}$$
$$V_{BEQA} = V_{BEQ6}(O)$$

Suppose initially that the current fed by the source $I_1$ is smaller than the current fed by the source $I_2$, that is $I_1 < I_2$.

In these conditions the transistors $Q_1$, $Q_2$, $Q_3$, $Q_6$ are off, while the transistors $Q_4$, $Q_5$ are on. Consequently the voltage of the output point D, $V_D$, tends to reach the positive supply voltage $V_{CC}$.

As the voltage in the point D rises, the voltage between base and emitter of the transistor $Q_B$ thus rises. Therefore, when the voltage $V_D - V_B$ assumes values proximate to 0.6 V, the base-emitter junction of the transistor $Q_B$ is directly biased, which thus begins to conduct current between the emitter and the collector. The collector current of $Q_B$, then, fed to the input point A, feeds the base of $Q_1$, preventing its complete switching off. In practice the current fed by the transistor $Q_B$ reduces the imbalance between the currents fed by the two sources and prevents the complete switching off of the transistors $Q_1$ and $Q_2$.

Since $V_{BEQ5} = V_{BEQ5}(O) + R_{BEQ5} \cdot I_{CQ5}$ see relation (I), introducing hypothesis (II), we may write:

$$V_{BEQ5} = V_{BEQB} + R_{BEQ5} \cdot I_{CQ5} \quad \text{(III)}$$

The balance of the system occurs when:

$$R_{Q5,sat} I_{CQ5} = V_{BEQ5} + R_B \cdot I_{bQ5} - V_{BEQB} = R_{BEQ5} I_{CQ5} + R_B \cdot I_{bQ5}$$

from which:

$$R_{Q5,sat} \cdot \beta_{Q5} = R_{BEQ5} \beta_{Q5} + R_B \quad \text{(IV)}$$

and $$\beta_{Q5} = \frac{R_B}{R_{Q5,sat} - R_{BEQ5}}$$

that is when the final transistor $Q_5$ is saturated with a gain given by equation (IV) and which is a function of the resistance value of the component $R_B$, so that by appropriately choosing this resistance it is possible to preset beforehand the saturation level of the final transistor, preventing the same from reaching a high saturation level, with gain lower than the preset one.

If instead the current fed by the sources $I_1$ is greater that the current fed by the source $I_2$, that is $I_1 > I_2$, the excess current of the source $I_1$ tends to saturate the transistor $Q_2$ and the transistor $Q_6$, causing the output D to drop towards the negative power supply.

When the voltage difference $V_C - V_D$ reaches approximately 0.6 V, directly biasing the base-collector junction of the transistor $Q_4$, the same switches on in the reverse bias state, conducting current from the emitter to the collector. The current drawn by $Q_A$ is in practice subtracted from the excess current fed by the source $I_1$, towards the base of $Q_1$, preventing the transistor $Q_2$ from reaching a high saturation condition.

The balance of the system is achieved when $$R_{Q6,sat} I_{CQ6} = V_{BEQ6} + R_A \cdot I_{bQ6} - V_{BCQA}$$

from which, as before, we obtain $$\beta_{Q6} = \frac{R_A}{R_{Q6,sat} - R_{BEQ6}} \quad (V)$$

Also in this case, therefore, the current gain of the final transistor $Q_6$ depends on the value of the base-connected resistance, so that it is possible to design the circuit by setting the current gain and therefore the saturation level of the transistor $Q_6$.

The fact is furthermore stressed that in the design of the circuit, by appropriately choosing the collector current fed by the transistor $Q_7$, it is possible to prevent the transistors $Q_2$ and $Q_7$ from saturating, during the normal operation of the amplifier stage with operating saturation control circuits.

Figure 4:
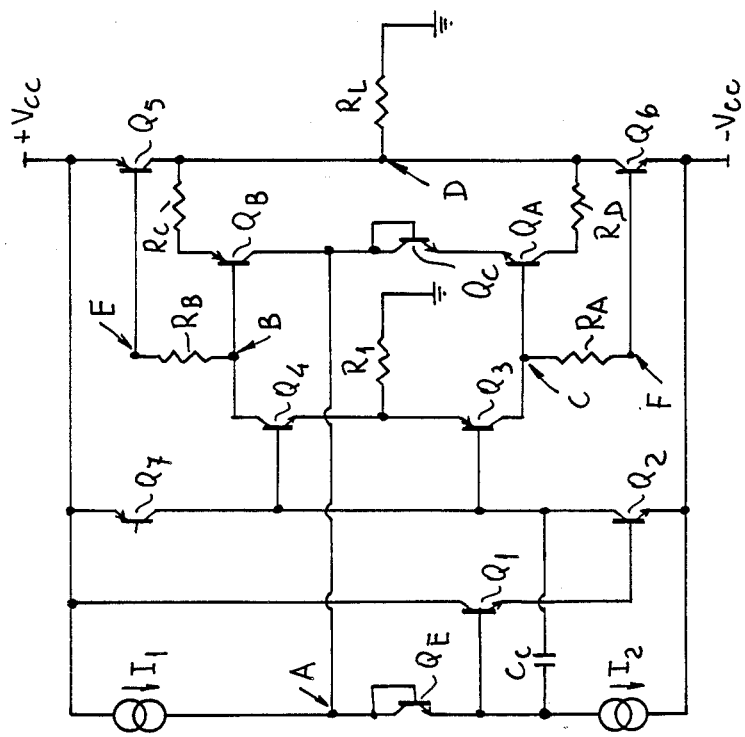
FIG. 4 is another circuit diagram of the amplifier stage according to the invention.

FIG. 4 illustrates a further amplifier stage according to the invention. Said circuit is provided essentially like the one of FIG. 2, but it furthermore comprises components suitable for some applications in which it may occur that the potential of point C is greater than point A, directly biasing the base-emitter junction of the transistor $Q_A$, so that the same drives the base of the transistor $Q_1$ in an undesired manner. To prevent the transistor $Q_A$ from switching on in the direct operation region, in the diagram of FIG. 4 a diode $Q_C$ has been added, placed between the emitter of the transistor $Q_A$ and point A and having the function of preventing the transistor $Q_A$ from conducting current from the collector to the emitter towards point A. The circuit of FIG. 4 furthermore comprises a second diode $Q_E$ connected with its anode to point A and with its cathode to the base of the transistor $Q_1$. Said diode, increasing the potential of point A by a base-emitter drop, prevents the saturated operation of $Q_A$.

In the circuit of FIG. 4 furthermore resistors $R_C$ and $R_D$ have been inserted, which are connected on one side to the emitter of the transistor $Q_B$ and respectively to the collector of the transistor $Q_A$, and on the other to the output of the amplifier stage. Said resistors may be necessary to decrease the voltage-current gain $$\frac{V_B - V_D}{I_{CQB}} \text{ and } \frac{V_C - V_D}{I_{CQ4}}$$

of the respective connected transistors, improving thereby the stability of the saturation gain control loops of the output transistors.

As is apparent from the previous description, the invention fully achieves the intended aim and objects. In fact, by virtue of the saturation control circuit it is possible, on one hand, to reduce the imbalance between the input currents which, as explained initially, would cause the imbalance of the entire amplifier stage, on the other hand it presets the value of the saturation gain in balanced situations, forcing the final transistors to operate with the preset gain, and preventing them from saturating further. The saturation level can furthermore be preset beforehand according to the requirements, by acting on the resistance of $R_A$ and $R_B$.

Furthermore, the integration of the saturation control circuit does not entail difficulties in production or integration, and the area bulk is small.

The circuit furthermore operates reliably and has high stability.

The invention thus conceived is susceptible to numerous modifications and variations, all within the scope of the inventive concept. In particular the fact is stressed that the transistors $Q_A$ and $Q_B$ may also be connected inversely, mutually exchanging the emitter and the collector. On this subject, the fact is stressed that the illustrated arrangement of the transistor $Q_A$, with the collector connected to the output and the emitter connected to the input of the stage, seems convenient to ensure the correct operation of the transistor regardless of the supply voltage. In fact, were the transistor $Q_A$ connected with the emitter towards the output, due to the low inverse breakdown voltage of the base-emitter junction of integrated NPN transistors (approximately 7 volts) when the voltage $V_D - V_F$ exceeds this breakdown voltage, malfunctions may occur.

On the contrary, the inverse breakdown voltage of the base-collector junction is always designed so as to be higher than the supply voltage, avoiding such problems.

The low current gain of the transistor $Q_A$ connected as illustrated does not represent a problem in the circuit: in fact it acts on low-current circuits (input circuits) taking the information in the driving circit and in the final circuit of the stage, which operate with much higher current levels.

However, if desired, if the supply voltage is lower than the base-emitter inverse breakdown voltage of the transistor $Q_A$, the same may be connected also in the opposite direction, that is with the emitter connected to the output of the stage and the collector connected to the input thereof. In this case it may be therefore convenient to provide the gain reduction resistors shown in FIG. 4.

The same is also true for the transistor $Q_B$, which may be connected with its emitter to the input and with its collector to the output. In this case, too, an inverse and low-gain operation would therefore be obtained, which however, as explained above, does not constitute a problem. The integration of the resistors $R_A$ and $R_B$ in the bases of $Q_6$ and $Q_5$ is also within the scope of the invention.

Finally, all the details may be replaced with other technically equivalent elements.

We claim:

1. An amplifier stage with collector output, comprising a pair of input current sources connected in series between a pair of reference voltage lines and feeding respective input currents, a pair of output transistors, connected in series between said pair of reference voltage lines and defining an intermediate output terminal of the amplifier stage, a driving circuit comprising active elements and interposed between said input current sources and said output transistors, and a pair of control circuits each controlling saturation of a respective one of said output transistors, each of said control circuits comprising resistive means interposed between said driving circuit and said respective output transistor for presetting a balance saturation gain of said respective output transistor, and transistor means having base terminals connected to said driving circit and collector and emitter terminals connected between said respective output transistor and said input current sources, and defining a negative feedback for reducing imbalance between said input currents fed by said input current sources.

2. An amplifier stage according to claim 1, wherein said resistive means of each saturation control circuit comprises a resistor having a first terminal connected to an output terminal of said driving circuit and a second terminal connected to said base terminal of said respective output transistor.

3. An amplifier stage according to claim 1, wherein at least one of said transistor means has said base terminal connected to an output terminal of said driving circuit, said emitter terminal connected to said output terminal of said amplifier stage and said collector terminal connected to an intermediate connection point between said current sources.

4. An amplifier stage according to claim 1, wherein at least one of said transistor means has said base terminal connected to an output terminal of said driving circuit, said collector terminal connected to said output terminal of said amplifier stage and said emitter terminal connected to an intermediate connection point between said current sources.

5. An amplifier stage according to claim 1, wherin said pair of current sources comprises a first and a second current source connected in series between a higher and a lower reference voltage line, and defining an intermediate connection point, said driving circuit comprises an input terminal connected to said intermediate connection point and first and second driving output terminals, said pair of output transistors comprises a first output transistor having an own base terminal connected to said first driving output terminal, an own emitter terminal connected to said higher reference voltage line and an own collector terminal connected to said output terminal of said amplifier stage, and a second output transistor having an own base terminal connected to said second driving output terminal, an own collector terminal connected to said output terminal of said amplifier stage and an own emitter terminal connected to said lower reference voltage line, and said pair of control circuits comprises a first and a second saturation control circuits including, respectively first and second control transistors, said first control transistor having an own base terminal connected to said first driving output terminal, an own emitter terminal connected to said output terminal of said amplifier stage and an own collector terminal connected to said intermediae connection point, and said second control tansistor has an own base terminal connected to said second driving output terminal, an own collector terminal connected to said output terminal of said stage and an own emitter terminal connected to said intermediate connection point.

6. An amplifier stage according to claim 5, further comprising a diode having an anode terminal connected to said intermediate connection point and a cathode terminal connected to said emitter terminal of said second control transistor.

7. An amplifier stage according to claim 5, further comprising a diode having an anode terminal connected to said intermediate connection point and a cathode of terminal connected to said input terminal of said driving circuit.

8. An amplifier stage according to claim 1, further comprising a pair of resistors, each resistor being interposed between a respective one of said transistor means and said output terminal of said amplifier stage.

* * * * *